United States Patent
Shang et al.

(10) Patent No.: US 12,019,115 B2
(45) Date of Patent: Jun. 25, 2024

(54) GATE DETECTION CIRCUIT OF INSULATED GATE BIPOLAR TRANSISTOR

(71) Applicant: GREAT WALL MOTOR COMPANY LIMITED, Hebei (CN)

(72) Inventors: Man Shang, Baoding (CN); Chunxin Xu, Baoding (CN); Xiyang Zhao, Baoding (CN)

(73) Assignee: GREAT WALL MOTOR COMPANY LIMITED, Hebei (CN)

( * ) Notice: Subject to any disclaimer, the term of this patent is extended or adjusted under 35 U.S.C. 154(b) by 246 days.

(21) Appl. No.: 17/765,577

(22) PCT Filed: Nov. 25, 2020

(86) PCT No.: PCT/CN2020/131427
§ 371 (c)(1),
(2) Date: Jul. 20, 2022

(87) PCT Pub. No.: WO2021/104297
PCT Pub. Date: Jun. 3, 2021

(65) Prior Publication Data
US 2023/0160945 A1  May 25, 2023

(30) Foreign Application Priority Data
Nov. 28, 2019  (CN) .......................... 201911190671.8

(51) Int. Cl.
*G01R 31/26* (2020.01)
*G01R 19/00* (2006.01)

(52) U.S. Cl.
CPC ..... *G01R 31/2608* (2013.01); *G01R 19/0038* (2013.01)

(58) Field of Classification Search
CPC ............ G01R 31/2608; G01R 19/0038; G01R 31/261; G01R 19/1659; G01R 29/027
See application file for complete search history.

(56) References Cited

U.S. PATENT DOCUMENTS

| 4,500,838 A * | 2/1985 | Bloomer | G01R 33/038 324/109 |
| 2001/0040450 A1* | 11/2001 | Li | G01R 33/18 324/260 |
| 2018/0006208 A1* | 1/2018 | Eid | H10N 30/306 |

FOREIGN PATENT DOCUMENTS

| CN | 102324918 A | 1/2012 |
| CN | 102510276 A | 6/2012 |

(Continued)

OTHER PUBLICATIONS

International Application No. PCT/CN2020/131427 International Search Report and Written Opinion with Partial English Machine Translation mailed Feb. 24, 2021, 9 pgs.

*Primary Examiner* — Giovanni Astacio-Oquendo
*Assistant Examiner* — Zannatul Ferdous
(74) *Attorney, Agent, or Firm* — Fredrikson & Byron, P.A.

(57) ABSTRACT

The present application provides a gate detection circuit of an insulated gate bipolar transistor. The pulse shaping circuit is configured for shaping an input signal of a signal input device, and outputting a first square wave signal of a high level and a second square wave signal of a low level; and outputting a first square wave signal of the low level and a second square wave signal of the high level; the comparison circuit is configured for: comparing a first preset voltage with a voltage of a gate of the insulated gate bipolar transistor, and outputting a low level; and comparing a second preset voltage with a voltage of a gate of the insulated gate bipolar transistor, and outputting a low level; and the fault output circuit is configured for outputting a gate fault signal.

20 Claims, 3 Drawing Sheets

(56) References Cited

FOREIGN PATENT DOCUMENTS

| | | |
|---|---|---|
| CN | 103199832 A | 7/2013 |
| CN | 103427809 A | 12/2013 |
| CN | 104237761 A | 12/2014 |
| CN | 204013200 U | 12/2014 |
| CN | 106099864 A | 11/2016 |
| CN | 107807319 A | 3/2018 |
| CN | 109061431 A | 12/2018 |
| CN | 109375087 A | 2/2019 |
| JP | 2002095240 A | 3/2002 |
| JP | 2017050804 A | 3/2017 |
| RU | 186888 U1 | 2/2019 |

\* cited by examiner

GATE DETECTION CIRCUIT OF INSULATED GATE BIPOLAR TRANSISTOR

CROSS REFERENCE TO RELATED APPLICATION

The present application is a National phase of international patent application No. PCT/CN2020/131427 with an international filling date of Nov. 25, 2020, designating the USA, now pending, and further claims priority of Chinese Invention Patent application, with Application No. 201911190671.8, filed on Nov. 28, 2019, the contents of all of the aforementioned application, including any intervening amendments thereto, are incorporated herein by reference.

TECHNICAL FIELD

The present application relates to the technical field of electronic circuits, and more particularly to a gate detection circuit of an insulated gate bipolar transistor.

BACKGROUND

The insulated gate bipolar transistor (IGBT) is a composite fully-controlled voltage-driven power semiconductor device composed of a bipolar triode and an insulated gate field effect transistor. The units of the IGBT configured for driving are provided with multiple IGBTs, and when one of the gates breaks down, other IGBTs may also be damaged. However, there is currently no technology to detect IGBT gate faults.

SUMMARY

In view of this, the present application aims to provide a gate detection circuit of an insulated gate bipolar transistor to detect the gate fault of the insulated gate bipolar transistor.

In order to achieve the above-mentioned object, the technical scheme of the present application is realized as follows:

A gate detection circuit of an insulated gate bipolar transistor, and the gate detection circuit includes: a pulse shaping circuit, a comparison circuit, and a fault output circuit; the pulse shaping circuit is configured for shaping an input signal of a signal input device, and outputting a first square wave signal of a high level and a second square wave signal of a low level when the input signal is at the high level; and outputting a first square wave signal of the low level and a second square wave signal of the high level when the input signal is at the low level; the comparison circuit is configured for: comparing a first preset voltage with a voltage of a gate of the insulated gate bipolar transistor when the first square wave signal is at the high level, and outputting a low level when the first preset voltage is greater than the voltage of the gate of the insulated gate bipolar transistor; and comparing a second preset voltage with a voltage of a gate of the insulated gate bipolar transistor when the second square wave signal is at the high level, and outputting a low level when the second preset voltage is lower than the voltage of the gate of the insulated gate bipolar transistor; and the fault output circuit is configured for outputting a gate fault signal when the comparison circuit outputs the low level.

Further, the comparison circuit includes: a first triode, configured to be turned on when the first square wave signal is at the high level; a second triode, configured to be turned on when the second square wave signal is at the high level; a first comparator, connected to the first triode and configured for comparing the first preset voltage with the voltage of the gate of the insulated gate bipolar transistor when the first triode is turned on; and a second comparator, connected to the second triode and configured for comparing the second preset voltage with the voltage of the gate of the insulated gate bipolar transistor when the second triode is turned on.

Further, the gate detection circuit further includes: an optocoupler isolation circuit, connected between the signal input device and the pulse shaping circuit, and configured for optoelectronic isolation of the input signal.

Further, the gate detection circuit further includes: a pulse amplification circuit, connected between the pulse shaping circuit and the insulated gate bipolar transistor, and configured for amplifying the first square wave signal to drive the insulated gate bipolar transistor.

Further, the gate detection circuit further includes: a voltage division circuit, connected to the comparison circuit, and configured for converting a voltage of a power supply into the first preset voltage and the second preset voltage.

Further, the gate detection circuit further includes: a detection power supply circuit, including:
a diode, with a negative electrode being connected to the gate of the insulated gate bipolar transistor, and a positive electrode being connected to the comparison circuit; and
a first resistor, with an end being connected to an anode of the diode, and the other end being connected to positive power output terminal of a power supply.

Further, the power supply outputs a positive power supply of +15V and a negative power supply of −5V.

Further, the first preset voltage is 7.5V, and the second preset voltage is −2.5V.

Further, the comparison circuit is further configured for: outputting the high level when the first preset voltage is lower than the voltage of the gate of the insulated gate bipolar transistor in a case that the first square wave signal is at the high level; and outputting the high level when the second preset voltage is greater than the voltage of the gate of the insulated gate bipolar transistor in a case that the second square wave signal is at the high level.

Further, the fault output circuit is further configured to not output a fault signal when the comparator circuit outputs the high level.

Compared to the prior art, the gate detection circuit of the insulated gate bipolar transistor described in the present application has the following advantages:

Using the pulse shaping circuit, the comparison circuit, and the fault output circuit, and the pulse shaping circuit is configured to output the first square wave signal of the high/low level and the second square wave signal of the high/low level; and using the comparison circuit to compare the first preset voltage with the voltage of the gate of the insulated gate bipolar transistor, or compare the second preset voltage with the voltage of the gate of the insulated gate bipolar transistor, and to output the low level when the first preset voltage is greater than the voltage of the gate of the insulated gate bipolar transistor or the second preset voltage is lower than the voltage of the gate of the insulated gate bipolar transistor; and finally, the fault output circuit outputs a gate fault signal when the comparison circuit outputs the low level; therefore, the gate fault of the insulated gate bipolar transistor can be detected.

The present application further provides a method for gate detection of an insulated gate bipolar transistor, to detect the gate fault of the insulated gate bipolar transistor.

In order to achieve the above-mentioned object, the technical scheme of the present application is realized as follows:

A method for gate detection of an insulated gate bipolar transistor, and the method includes: shaping a input signal of a signal input device through a pulse shaping circuit, and outputting a first square wave signal of a high level and a second square wave signal of a low level when the input signal is at the high level; and outputting a first square wave signal of the low level and a second square wave signal of the high level when the input signal is at the low level; comparing, through a comparison circuit, a first preset voltage with a voltage of a gate of the insulated gate bipolar transistor when the first square wave signal is at the high level, and outputting a low level when the first preset voltage is greater than the voltage of the gate of the insulated gate bipolar transistor; and comparing, through the comparison circuit, a second preset voltage with a voltage of a gate of the insulated gate bipolar transistor when the second square wave signal is at the high level, and outputting a low level when the second preset voltage is lower than the voltage of the gate of the insulated gate bipolar transistor; and outputting, through a fault output circuit, a gate fault signal when the comparison circuit outputs the low level.

Further, the method further includes: outputting the high level when the first preset voltage is lower than the voltage of the gate of the insulated gate bipolar transistor in a case that the first square wave signal is at the high level; and outputting the high level when the second preset voltage is greater than the voltage of the gate of the insulated gate bipolar transistor in a case that the second square wave signal is at the high level.

The advantages of the method for gate detection of the insulated gate bipolar transistor described above are similar to those of the gate detection circuit of the insulated gate bipolar transistor described above, and will not be repeated herein.

The present application further provides an electric vehicle, to detect the gate fault of the insulated gate bipolar transistor.

In order to achieve the above-mentioned object, the technical scheme of the present application is realized as follows:

An electric vehicle, and the electric vehicle includes the gate detection circuit of an insulated gate bipolar transistor described above.

The advantages of the electric vehicle described above are similar to those of the gate detection circuit of the insulated gate bipolar transistor described above, and will not be repeated herein.

Other features and advantages of the present application will be described in detail in the detailed description that follows.

BRIEF DESCRIPTION OF THE DRAWINGS

The accompanying drawings constituting a part of the present application are used to provide further understanding of the present application, and the schematic embodiments of the present application and descriptions thereof are used to explain the present application and do not constitute an improper limitation of the present application. In the drawings.

Figure 1:
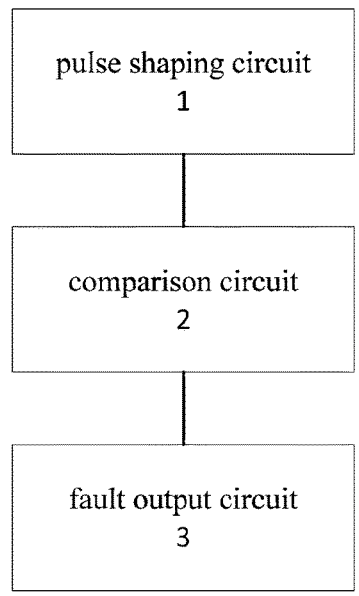
FIG. 1 is a structural block diagram of a gate detection circuit of an insulated gate bipolar transistor provided by an embodiment of the present application.

The reference numerals are listed as following:

1—pulse shaping circuit;
2—comparison circuit;
2—fault output circuit,
4—optocoupler isolation circuit;
5—pulse amplification circuit;
6—voltage division circuit; and
7—detection power supply circuit.

DETAILED DESCRIPTION

It should be noted that the embodiments of the present application and the features of the embodiments may be combined with each other unless there is conflict.

The present application will be described in detail below with reference to the accompanying drawings and in conjunction with the embodiments.

FIG. 1 is a structural block diagram of a gate detection circuit of an insulated gate bipolar transistor according to an embodiment of the present application. As shown in FIG. 1, the circuit includes: a pulse shaping circuit 1, a comparison circuit 2, and a fault output circuit 3.

The pulse shaping circuit 1 is configured for shaping an input signal of a signal input device, and outputting a first square wave signal of a high level and a second square wave signal of a low level when the input signal is at the high level; and outputting a first square wave signal of the low level and a second square wave signal of the high level when the input signal is at the low level.

Specifically, the signal input device is, for example, a motor drive controller of an electric vehicle, and the input signal is, for example, a pulse width modulation (PWM) signal of a drive board, but is not limited thereto. The pulse shaping circuit 1 can shape the input signal into a square wave, and output the complementary first square wave signal and the second square wave signal in different level states according to the different level states of the input signal, and the level states of the first square wave signal and the second square wave signal may affect which preset voltage the comparison circuit 2 uses for comparison.

The comparison circuit 2 is configured for: comparing a first preset voltage with a voltage of a gate of the insulated gate bipolar transistor when the first square wave signal is at the high level, and outputting a low level when the first preset voltage is greater than the voltage of the gate of the insulated gate bipolar transistor; and comparing a second preset voltage with a voltage of a gate of the insulated gate bipolar transistor when the second square wave signal is at the high level, and outputting a low level when the second preset voltage is lower than the voltage of the gate of the insulated gate bipolar transistor.

Specifically, the comparison circuit 2 can use two preset voltages to compare with the voltage of the gate of the insulated gate bipolar transistor, since the level state of the input signal varies with the signal input device, the normal insulated gate bipolar transistor will also have two states of on and off, so that the voltage of the gate will also be different. For example, assuming that under the action of an external power supply with 15V, when the input signal is at high level, the voltage of the gate of the insulated gate bipolar transistor can be 15V, and when the input signal is at low level, the voltage of the gate of the insulated gate bipolar transistor may be −5V. In addition, when the gate of the insulated gate bipolar transistor fails, the voltage of the gate of the insulated gate bipolar transistor is 0V. In this regard, the first preset voltage can be set to 7.5V, and the second preset voltage can be set to −2.5V, so as to effectively determine that the insulated gate bipolar transistor will have gate faults in both on and off states. It can be understood that the above data is only an example (the same below), which is not limited in the present application. For example, the first preset voltage may be a voltage greater than 0 and less than 15V, and the second preset voltage may also be a voltage greater than −5V and less than −2.5V.

The fault output circuit 3 is configured to output a gate fault signal when the comparison circuit 2 outputs the low level.

Specifically, the gate fault in the embodiments of the present application is, for example, gate breakdown. The fault output circuit 3 outputs the gate fault signal to the signal input device when the comparator circuit 2 outputs the low level.

Figure 2:
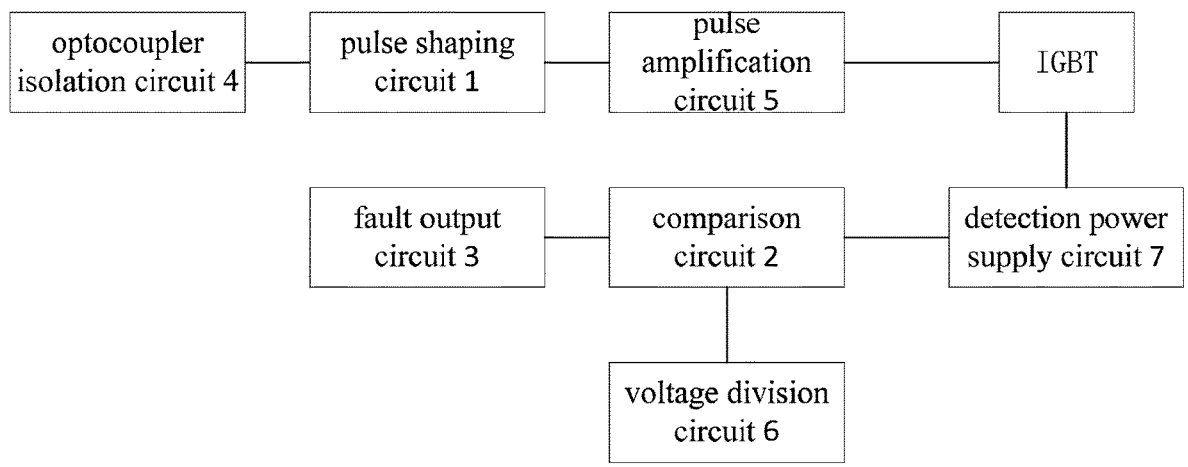
FIG. 2 is a structural block diagram of a gate detection circuit of an insulated gate bipolar transistor provided by another embodiment of the present application.

FIG. 2 is a structural block diagram of a gate detection circuit of an insulated gate bipolar transistor according to another embodiment of the present application. As shown in FIG. 2, the circuit further includes:

an optocoupler isolation circuit 4, connected between the signal input device and the pulse shaping circuit 1, and configured for optoelectronic isolation of the input signal.

a pulse amplification circuit 5, connected between the pulse shaping circuit 1 and the insulated gate bipolar transistor, and configured for amplifying the first square wave signal to drive the insulated gate bipolar transistor.

a voltage division circuit 6, connected to the comparison circuit 2, and configured for converting a voltage of a power supply into the first preset voltage and the second preset voltage.

a detection power supply circuit 7, connected to the comparison circuit 2 and the gate of the insulated gate bipolar transistor, and configured for providing an external power supply to the comparison circuit 2 and the gate of the insulated gate bipolar transistor.

More specific functions of the above-mentioned parts will be detailed below through detailed circuit components.

Figure 3:
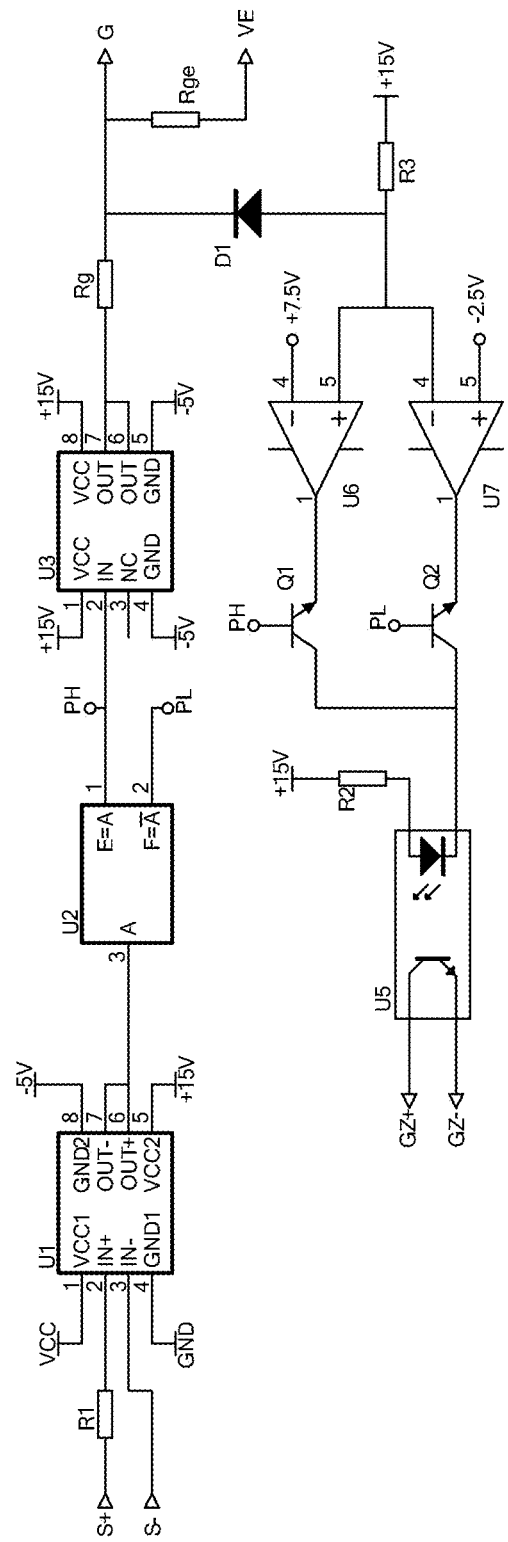
FIG. 3 is a schematic diagram of a gate detection circuit of an insulated gate bipolar transistor provided by an embodiment of the present application.

FIG. 3 is a schematic diagram of a gate detection circuit of an insulated gate bipolar transistor according to an embodiment of the present application. As shown in FIG. 3:

S+ and S− are the input signals of the PWM of the driver board.

U1 is the isolation optocoupler of the optocoupler isolation circuit 4, which plays the role of signal isolation and can be connected to the power supply, such as the positive power supply of +15V and the negative power supply of −5V. Resistor R1 is the current limiting resistor on the input side of the isolation optocoupler U1.

U2 is the pulse shaper of the pulse shaping circuit 1, which shapes the output signal of the isolation optocoupler U1 into a square wave, and outputs two complementary signals PH and PL.

U3 is a push-pull driver of the pulse amplification circuit 5, which can amplify the PH signal for driving the insulated gate bipolar transistor to be turned on.

Resistor Rg is the gate resistor of the insulated gate bipolar transistor. In the figure, G is connected to the gate G of the insulated gate bipolar transistor, VE is connected to the emitter E of the insulated gate bipolar transistor, and the resistor Rge is an anti-open circuit resistor connected in parallel between the G and E terminals of the insulated gate bipolar transistor.

Diode D1 and a resistor R3 constitute the detection power supply circuit 7. The cathode of the diode D1 is connected to the gate of the insulated gate bipolar transistor, the anode is connected to the comparator circuit 2, one end of the resistor R3 is connected to the anode of the diode D1, and the other end is connected to the positive power output terminal of the power supply, a positive power supply such as +15V.

A first triode Q1, a second triode Q2, a first comparator U6, and the second comparator U7 consist of the comparison circuit 2. Among them, the first triode Q1 is configured to be turned on when the first square wave signal PH is at the high level; the second triode Q2 is configured to be turned on when the second square wave signal PL is at the high level; the first comparator U6 is connected to the first triode Q1, and configured for comparing the first preset voltage (eg 7.5V) with the voltage of the gate of the insulated gate bipolar transistor when the first triode Q1 is turned on, and outputting the low level when the first preset voltage is greater than the voltage of the gate of the insulated gate bipolar transistor, outputting the high level the first preset voltage is less than the voltage of the gate of the insulated gate bipolar transistor; the second comparator U7 is connected to the second triode Q2, and is configured for comparing the second preset voltage (eg −2.5V) with the voltage of the gate of the insulated gate bipolar transistor when the second triode Q2 is turned on, and outputting the low level when the second preset voltage is lower than the voltage of the gate of the insulated gate bipolar transistor, outputting the high level the second preset voltage is greater than the voltage of the gate of the insulated gate bipolar transistor.

U5 is the common optocoupler of the fault output circuit 3, which can be connected to the positive power supply of +15V. The resistor R2 is the current limiting resistor of the optocoupler U5. When the comparator circuit 2 outputs the low level, the gate fault signals GZ+ and GZ− are output.

Figure 4:
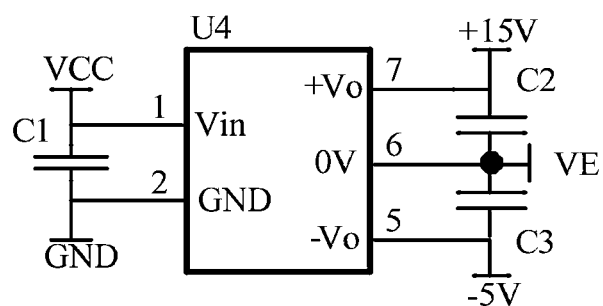
FIG. 4 is a schematic diagram of a power supply provided by an embodiment of the present application.

FIG. 4 is a schematic diagram of a power supply provided by an embodiment of the present application. As shown in FIG. 4, U4 is the power supply, and the power supply can output a positive power supply of +15V and a negative power supply of −5V. Capacitors C1-C3 are filter capacitors of the power supply, and the VE terminal is connected to the emitter E of the insulated gate bipolar transistor.

Figure 5:
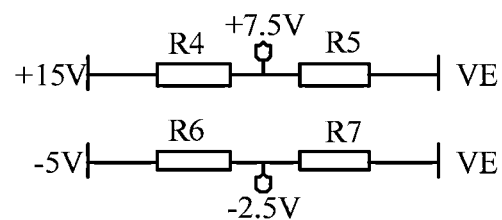
FIG. 5 is a schematic diagram of a voltage division circuit provided by an embodiment of the present application.

FIG. 5 is a schematic diagram of a voltage division circuit provided by an embodiment of the present application. As shown in FIG. 5, the voltage division circuit 6 receives the positive power supply of +15V and the negative power supply of −5V output by the power supply, and divides the voltage through R4-R7 to output the first preset voltages of +7.5V and the second preset voltage of −2.5V to the comparison circuit 2. Similarly, the VE terminal is connected to the emitter E of the insulated gate bipolar transistor.

The working process of the gate detection circuit of the insulated gate bipolar transistor of the present application is described in detail below:

When the PWM input signal is at the high level, the isolation optocoupler U1 is turned on, the first square wave signal PH is 1 (high level), the second square wave signal PL is 0 (low level), the gate voltage of the insulated gate bipolar transistor is normally 15V, the first triode Q1 is turned on, the second triode Q2 is turned off, the pin-5 of the first comparator U6 is 15V, the first preset voltage is 7.5V which is less than 15V, the pin-1 output of the first comparator U6 is at the high level, the pin-1 output of the second comparator U7 is shielded, the optocoupler U5 is turned off, and no fault signal is output; at this time, if the gate of the insulated gate bipolar transistor breaks down, the gate voltage of the insulated gate bipolar transistor is reduced to VE (0V), then the pin-5 of the first comparator U6 is 0V, which is less than the first preset voltage of 7.5V, and the pin-1 output of the first comparator U6 is at the low level, the optocoupler U5 is turned on, and the fault signal is output.

When the PWM input signal is at the low level, the isolation optocoupler U1 is turned off, the first square wave signal PH is 0 (low level), the second square wave signal PL is 1 (high level), and the gate voltage of the insulated gate bipolar transistor is normally −5V, the first triode Q1 is turned off, the second triode Q2 is turned on, the pin-4 of the first comparator U6 is −5V, which is lower than second preset voltage of −2.5V, the pin-1 output of the comparator U7 is the high level, the pin-1 output of the first comparator U6 is shielded, the optocoupler U5 is turned off, and no fault signal is output; at this time, if the gate of the insulated gate bipolar transistor breaks down, the gate voltage of the insulated gate bipolar transistor is raised to VE (0V), the pin-4 of the second comparator U7 is 0V, which is greater than the second preset voltage of −2.5V, and the pin-1 output of the second comparator U7 is the low level, the optocoupler U5 is turned on, and a fault signal is output.

The gate fault detection circuit of the insulated gate bipolar transistor of the present application can detect the gate of the insulated gate bipolar transistor in real time regardless of whether the insulated gate bipolar transistor is turned on or off after the gate of the insulated gate bipolar transistor is broken down failure, so that detects such as shutdown can be taken in time to avoid damage to other insulated gate bipolar transistors.

The present application also provides a method for gate detection of an insulated gate bipolar transistor, the method includes: shaping a input signal of a signal input device through a pulse shaping circuit, and outputting a first square wave signal of a high level and a second square wave signal of a low level when the input signal is at the high level; and outputting a first square wave signal of the low level and a second square wave signal of the high level when the input signal is at the low level; comparing, through a comparison circuit, a first preset voltage with a voltage of a gate of the insulated gate bipolar transistor when the first square wave signal is at the high level, and outputting a low level when the first preset voltage is greater than the voltage of the gate of the insulated gate bipolar transistor; and comparing, through the comparison circuit, a second preset voltage with a voltage of a gate of the insulated gate bipolar transistor when the second square wave signal is at the high level, and outputting a low level when the second preset voltage is lower than the voltage of the gate of the insulated gate bipolar transistor; and outputting, through a fault output circuit, a gate fault signal when the comparison circuit outputs the low level.

Further, the method further includes: outputting the high level when the first preset voltage is lower than the voltage of the gate of the insulated gate bipolar transistor in a case that the first square wave signal is at the high level; and outputting the high level when the second preset voltage is greater than the voltage of the gate of the insulated gate bipolar transistor in a case that the second square wave signal is at the high level.

The present application also provides an electric vehicle including the gate detection circuit of the insulated gate bipolar transistor described above.

The above descriptions are only preferred embodiments of the present application, and are not intended to limit the present application. Any modifications, equivalent replacements, improvements, etc. made within the principles of the present application shall be included within the protection scope of the present application.

What is claimed is:

1. A gate detection circuit of an insulated gate bipolar transistor, wherein the gate detection circuit comprises:
    a pulse shaping circuit, configured for shaping an input signal of a signal input device, and
        outputting a first square wave signal of a high level and a second square wave signal of a low level when the input signal is at the high level; and
        outputting a first square wave signal of the low level and a second square wave signal of the high level when the input signal is at the low level;
    a comparison circuit, configured for:
        comparing a first preset voltage with a voltage of a gate of the insulated gate bipolar transistor when the first square wave signal is at the high level, and outputting a low level when the first preset voltage is greater than the voltage of the gate of the insulated gate bipolar transistor; and
        comparing a second preset voltage with a voltage of a gate of the insulated gate bipolar transistor when the second square wave signal is at the high level, and outputting a low level when the second preset voltage is lower than the voltage of the gate of the insulated gate bipolar transistor; and
    a fault output circuit, configured for outputting a gate fault signal when the comparison circuit outputs the low level.

2. The gate detection circuit of an insulated gate bipolar transistor according to claim 1, wherein the comparison circuit comprises:
    a first triode, configured to be turned on when the first square wave signal is at the high level;
    a second triode, configured to be turned on when the second square wave signal is at the high level;
    a first comparator, connected to the first triode and configured for comparing the first preset voltage with the voltage of the gate of the insulated gate bipolar transistor when the first triode is turned on; and
    a second comparator, connected to the second triode and configured for comparing the second preset voltage with the voltage of the gate of the insulated gate bipolar transistor when the second triode is turned on.

3. The gate detection circuit of an insulated gate bipolar transistor according to claim 1, wherein the gate detection circuit further comprises:
    an optocoupler isolation circuit, connected between the signal input device and the pulse shaping circuit, and configured for optoelectronic isolation of the input signal.

4. The gate detection circuit of an insulated gate bipolar transistor according to claim 1, wherein the gate detection circuit further comprises:
    a pulse amplification circuit, connected between the pulse shaping circuit and the insulated gate bipolar transistor, and configured for amplifying the first square wave signal to drive the insulated gate bipolar transistor.

5. The gate detection circuit of an insulated gate bipolar transistor according to claim 1, wherein the gate detection circuit further comprises:
a voltage division circuit, connected to the comparison circuit, and configured for converting a voltage of a power supply into the first preset voltage and the second preset voltage.

6. The gate detection circuit of an insulated gate bipolar transistor according to claim 5, wherein the power supply outputs a positive power supply of +15V and a negative power supply of −5V.

7. The gate detection circuit of an insulated gate bipolar transistor according to claim 1, wherein the gate detection circuit further comprises:
a detection power supply circuit, comprising:
a diode, with a negative electrode being connected to the gate of the insulated gate bipolar transistor, and a positive electrode being connected to the comparison circuit; and
a first resistor, with an end being connected to an anode of the diode, and the other end being connected to ta positive power output terminal of a power supply.

8. The gate detection circuit of an insulated gate bipolar transistor according to claim 1, wherein the first preset voltage is 7.5V, and the second preset voltage is −2.5V.

9. The gate detection circuit of an insulated gate bipolar transistor according to claim 1, wherein the comparison circuit is further configured for:
outputting the high level when the first preset voltage is lower than the voltage of the gate of the insulated gate bipolar transistor in a case that the first square wave signal is at the high level; and
outputting the high level when the second preset voltage is greater than the voltage of the gate of the insulated gate bipolar transistor in a case that the second square wave signal is at the high level.

10. The gate detection circuit of an insulated gate bipolar transistor according to claim 1, wherein the fault output circuit is further configured to not output a fault signal when the comparator circuit outputs the high level.

11. The gate detection circuit of an insulated gate bipolar transistor according to claim 1, wherein the first preset voltage is 7.5V, and the second preset voltage is −2.5V.

12. A method for gate detection of an insulated gate bipolar transistor, comprising:
shaping a input signal of a signal input device through a pulse shaping circuit, and outputting a first square wave signal of a high level and a second square wave signal of a low level when the input signal is at the high level; and outputting a first square wave signal of the low level and a second square wave signal of the high level when the input signal is at the low level;
comparing, through a comparison circuit, a first preset voltage with a voltage of a gate of the insulated gate bipolar transistor when the first square wave signal is at the high level, and outputting a low level when the first preset voltage is greater than the voltage of the gate of the insulated gate bipolar transistor; and comparing, through the comparison circuit, a second preset voltage with a voltage of a gate of the insulated gate bipolar transistor when the second square wave signal is at the high level, and outputting a low level when the second preset voltage is lower than the voltage of the gate of the insulated gate bipolar transistor; and
outputting, through a fault output circuit, a gate fault signal when the comparison circuit outputs the low level.

13. The method for gate detection of an insulated gate bipolar transistor according to claim 12, wherein the method further comprises:
outputting the high level when the first preset voltage is lower than the voltage of the gate of the insulated gate bipolar transistor in a case that the first square wave signal is at the high level; and
outputting the high level when the second preset voltage is greater than the voltage of the gate of the insulated gate bipolar transistor in a case that the second square wave signal is at the high level.

14. The electric vehicle according to claim 12, wherein the comparison circuit comprises:
a first triode, configured to be turned on when the first square wave signal is at the high level;
a second triode, configured to be turned on when the second square wave signal is at the high level;
a first comparator, connected to the first triode and configured for comparing the first preset voltage with the voltage of the gate of the insulated gate bipolar transistor when the first triode is turned on; and
a second comparator, connected to the second triode and configured for comparing the second preset voltage with the voltage of the gate of the insulated gate bipolar transistor when the second triode is turned on.

15. The electric vehicle according to claim 12, wherein the gate detection circuit further comprises:
an optocoupler isolation circuit, connected between the signal input device and the pulse shaping circuit, and configured for optoelectronic isolation of the input signal.

16. The electric vehicle according to claim 15, wherein the power supply outputs a positive power supply of +15V and a negative power supply of −5V.

17. The electric vehicle according to claim 12, wherein the gate detection circuit further comprises:
a pulse amplification circuit, connected between the pulse shaping circuit and the insulated gate bipolar transistor, and configured for amplifying the first square wave signal to drive the insulated gate bipolar transistor.

18. The electric vehicle according to claim 12, wherein the gate detection circuit further comprises:
a voltage division circuit, connected to the comparison circuit, and configured for converting a voltage of a power supply into the first preset voltage and the second preset voltage.

19. The electric vehicle according to claim 12, wherein the gate detection circuit further comprises:
a detection power supply circuit, comprising:
a diode, with a negative electrode being connected to the gate of the insulated gate bipolar transistor, and a positive electrode being connected to the comparison circuit; and
a first resistor, with an end being connected to an anode of the diode, and the other end being connected to ta positive power output terminal of a power supply.

20. An electric vehicle, comprising a gate detection circuit of an insulated gate bipolar transistor, wherein the gate detection circuit comprises:
a pulse shaping circuit, configured for shaping an input signal of a signal input device, and
outputting a first square wave signal of a high level and a second square wave signal of a low level when the input signal is at the high level; and
outputting a first square wave signal of the low level and a second square wave signal of the high level when the input signal is at the low level;

a comparison circuit, configured for:
- comparing a first preset voltage with a voltage of a gate of the insulated gate bipolar transistor when the first square wave signal is at the high level, and outputting a low level when the first preset voltage is greater than the voltage of the gate of the insulated gate bipolar transistor; and
- comparing a second preset voltage with a voltage of a gate of the insulated gate bipolar transistor when the second square wave signal is at the high level, and outputting a low level when the second preset voltage is lower than the voltage of the gate of the insulated gate bipolar transistor; and a fault output circuit, configured for outputting a gate fault signal when the comparison circuit outputs the low level.

* * * * *